United States Patent [19]

Kamoshida et al.

[11] 4,174,567

[45] Nov. 20, 1979

[54] APPARATUS FOR STORING AND SUPPLYING PARALLEL LEAD ELECTRONIC CIRCUIT ELEMENTS

[75] Inventors: Masakazu Kamoshida; Keiichi Ihara, both of Tokyo, Japan

[73] Assignee: Tokyo Denki Kagaku Kogyo Kabushiki Kaisha, Tokyo, Japan

[21] Appl. No.: 811,919

[22] Filed: Jun. 30, 1977

[30] Foreign Application Priority Data

Sep. 16, 1976 [JP] Japan .................. 51-111013

[51] Int. Cl.$^2$ .................. H05K 3/30
[52] U.S. Cl. .................. 29/741; 29/759; 226/76; 226/82; 226/109; 312/91
[58] Field of Search .................. 242/103; 226/109, 76, 226/82, 83; 29/741, 564.6, 759; 221/70–74, 30; 211/184; 312/91; 220/22

[56] References Cited

U.S. PATENT DOCUMENTS

| | | | |
|---|---|---|---|
| 1,538,477 | 5/1925 | Epstein | 242/103 X |
| 2,172,812 | 9/1939 | van Weenen | 226/82 |
| 2,914,643 | 11/1959 | Fields et al. | 226/76 X |
| 3,160,282 | 12/1964 | Gunn | 211/184 |
| 3,231,130 | 1/1966 | Foote | 221/70 |
| 3,839,787 | 10/1974 | Brown et al. | 29/564.6 X |
| 4,051,593 | 10/1977 | Mori et al. | 29/741 |

FOREIGN PATENT DOCUMENTS

522037 3/1953 Belgium .................. 221/30

*Primary Examiner*—Francis J. Bartuska
*Attorney, Agent, or Firm*—Blum, Moscovitz, Friedman & Kaplan

[57] ABSTRACT

An apparatus for storing and supplying parallel lead circuit elements that are secured to an elongated web is provided. The apparatus is adapted to supply the parallel lead circuit elements to a mechanism particularly adapted to process and secure the parallel lead electronic circuit elements to a printed circuit board. Storage and supply of the electronic circuit elements is affected by winding each of the webs carrying the parallel lead circuit elements about a reel, which reel is enclosed in a case. The apparatus is adapted to support each of the cases at predetermined positions and further dispose appropriate guiding and feeding structure proximate to each of the cases to effect guiding and feeding of each of the webs to the mechanism for processing and securing the parallel lead electronic circuit elements to a printed circuit board.

10 Claims, 20 Drawing Figures

000
APPARATUS FOR STORING AND SUPPLYING PARALLEL LEAD ELECTRONIC CIRCUIT ELEMENTS

BACKGROUND OF THE INVENTION

This invention is directed to an apparatus for storing and supplying parallel lead circuit elements and, in particular, to an apparatus for storing and supplying parallel lead circuit elements carried on an elongated web and stored in appropriate cases to apparatus for processing and securing the parallel lead electronic circuit elements to a printed circuit board.

Heretofore, machinery for processing and securing parallel lead electronic circuit elements to a printed circuit board have taken on various forms. A particularly efficient type of apparatus for processing and securing parallel lead electronic circuit elements to a printed circuit board is shown and described in U.S. patent application Ser. No. 672,944, filed on Apr. 2, 1976 now U.S. Pat. No. 4,054,988, and assigned to the same Assignee as the instant invention. Such apparatus for processing and securing parallel lead electronic circuit elements to a print circuit board effect storage of the parallel lead circuit elements on elongated webs, which webs are wound upon reels. The reels are adapted to be disposed in a supply mechanism to effect parallel delivery of a plurality of webs to appropriate processing and securing mechanisms so that the respective parallel lead circuit elements are automatically secured to a printed circuit board. It is noted however that the reels are shipped and stored in cases having the circuit elements wound thereon. These cases require the removal of the reels therefrom and the placement of the reels on the supply mechanism, and therefore have been found to be less than completely satisfactory. Accordingly, an apparatus for storing and supplying parallel lead electronic circuit elements carried on elongated webs to permit same to be readily supplied to machinery for processing and securing same to a printed circuit board is desired.

SUMMARY OF THE INVENTION

Generally speaking, in accordance with the instant invention, an apparatus for storing and supplying parallel lead electronic circuit elements disposed on elongated webs to a mechanism particularly adapted to process and secure parallel lead circuit elements to a printed circuit board is provided. Each of the elongated webs supporting parallel lead circuit elements are wound about support reels, which support reels are disposed in cases having an access opening formed therein. A support member is provided for supporting each of the cases at predetermined positions, the support member further supporting appropriate guiding and feeding elements disposed proximate to the openings in the respective cases for permitting the webs to be readily displaced from the cases and incrementally advanced thereby. Guide elements are positioned with respect to the guiding and feeding mechanism to receive the respective elongated webs and direct the parallel lead circuit elements supported on the elongated webs to the machinery for processing and securing the circuit elements to a printed circuit board.

Accordingly, it is an object of this invention to provide an improved apparatus for storing and supplying parallel lead circuit elements carried on elongated webs.

A further object of the instant invention is to store elongated webs carrying parallel lead circuit elements in cases and for providing apparatus for directly supplying the webs and parallel lead circuit elements carried thereby to apparatus for processing and securing the parallel lead circuit elements to a printed circuit board.

A further object of the instant invention is to provide an apparatus for storing and supplying parallel lead electronic circuit elements that is substantially reduced in size, easy to maintain, provides more reliable operation, and is easier to inspect during operation.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

Figure 1:
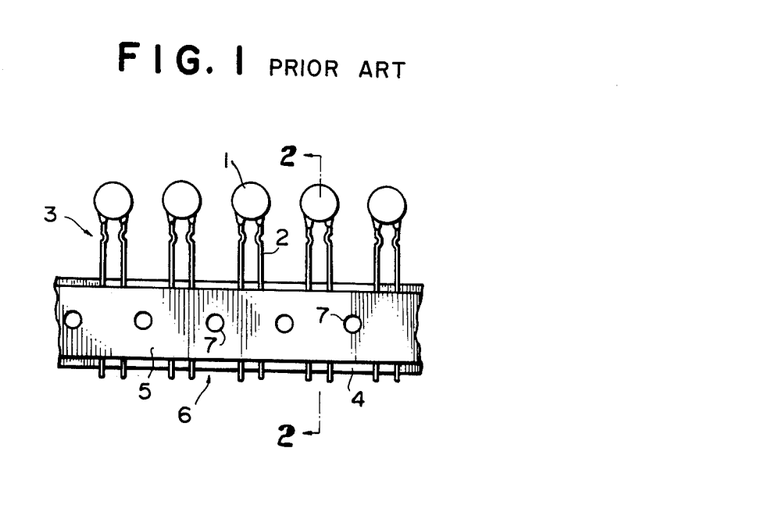
FIG. 1 is an elevational view of a parallel lead circuit element web carrier constructed in accordance with the prior art.
Figure 2:
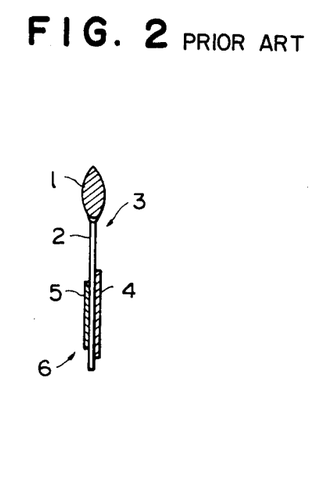
FIG. 2 is a sectional view taken along line 2—2 of FIG. 1.
Figure 3:
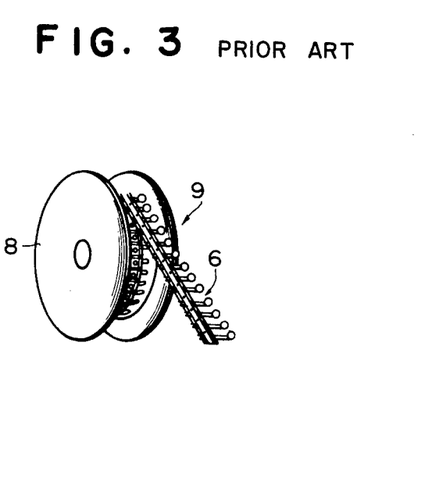
FIG. 3 is a perspective view of a parallel lead circuit element web carrier reel assembly constructed in accordance with the prior art.

Reference is first made to FIG. 1 and, wherein parallel lead circuit elements, generally indicated as 3, carried on a web carrier, generally indicated as 6, are depicted. By way of example the parallel lead circuit elements carried on a web carrier, illustrated in FIGS. 1 and 2, are described in detail in U.S. patent application Ser. No. 791,363, filed Apr. 27, 1977. Each parallel lead electronic circuit element is a particular circuit element, such as a capacitor 1, and includes two lead wires 2, disposed in parallel with respect to each other. The web carrier 6 is comprised of a support band 4 and an adhesive tape 5, which tape 5 is utilized to secure the respective parallel lead circuit elements 3 between same and the support band. Openings 7 are formed in the web carrier 6 to permit advancement of the web carrier in a manner to be discussed in greater detail below. As is illustrated in FIG. 3, each of the web carriers 6 are wound upon a reel 8 to define a reel assembly, generally indicated as 9, which reel assembly is stored until the apparatus for processing and securing parallel lead electronic circuit elements to a printed circuit board is utilized. It is noted that such reel assemblies are packaged and stored in cases and are removed from the cases when the parallel lead circuit elements, disposed on the web carrier, are to be secured to a printed circuit board.

Figure 4:
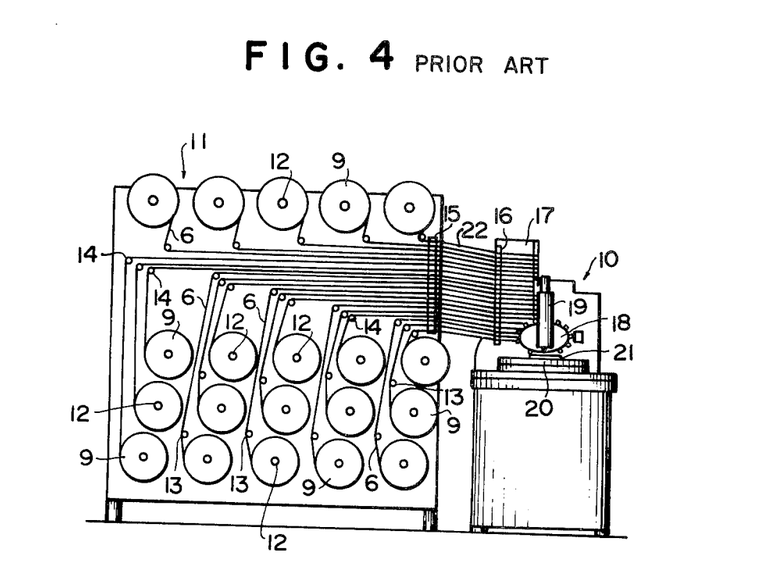
FIG. 4 is an elevational view of an apparatus for supplying parallel lead circuit elements constructed in accordance with the prior art.

Reference is now made to FIG. 4, wherein apparatus for processing and securing parallel lead circuit elements to a printed circuit board, of the type well known in the art, is depicted. By way of example, the apparatus for processing and securing parallel lead electronic circuit elements to a printed circuit board, illustrated in FIG. 4, is described in detail in U.S. patent application Ser. No. 672,944, filed Apr. 2, 1976, and is incorporated by reference, as if fully set forth herein.

In particular, a reel support member 11 is disposed in alignment with an inserting apparatus 10 in order to supply the parallel lead circuit elements to the inserting apparatus. The reel support member 11 includes a plurality of reel support shafts 12, upon which the respective reel assemblies are disposed. The reel support member 11 supports guide rollers 13 proximate to each reeled assembly for guiding the web carriers 6 and, additionally, further supports a plurality of feed rollers 14, which feed rollers are adapted to incrementally advance the respective web carriers toward the inserting apparatus 10. A comb-like guide 15 is disposed on the reel support member 11 for directing each of the web carriers toward the inserting apparatus. The inserting apparatus 10 includes a guide 16, which guide defines a supply zone 17, a delivery mechanism 18, and insertion mechanism 19 and a work table 20. Printed circuit boards are positioned on the work table 20 for the purpose of having the parallel lead electronic circuit elements carried by the web carriers processed and secured thereto. A plurality of flexible guide plates 22 are secured between the guide 15 disposed on the reel support plate 11 and the guide 16 disposed on the insertion apparatus 10 to effect a guidance of the respective web carriers from the reel support member to the insertion apparatus. Nevertheless, in order to insure that the respective webs are introduced to the insertion apparatus at a proper elevation, the guide 16 is vertically displaced, in order to introduce the selected web carrier at the proper elevation. Thus, it is necessary for the guide plates to be formed of a sufficiently flexible material to permit same to sufficiently flex as the guide 16 is raised and lowered.

In operation, the reel support and supply assembly, illustrated in FIG. 4, is operated by removing the respective reel assemblies from the cases in which same are packaged and attaching same to the support shafts 12. The respective web carriers are unwound by the feed rollers 14, guided by the guide rollers 13 and are delivered thereby through the guide 15, through the flexible guide plates 22 to the guide 16, defining the supply zone 17. The guide 16 selects the respective elevations at which each of the webs are introduced to the supply zone. Specifically, when the insertion apparatus commences operation, the feed rollers 14 are automatically rotated by a predetermined program, so that the radial projections (sprockets) on the feed rollers 17 engage the openings 7 in the web carrier 6 to thereby incrementally advance same by a distance equal to one pitch of the feed rollers. One pitch of the feed rollers represent a sufficient length of the web carrier to supply a parallel lead circuit element to the delivery mechanism 18, wherein same can be processed by the insertion mechanism. Once the portion of the web, delivered to the delivery mechanism, is spliced off the web carrier, the web carrier is cut away from the parallel lead circuit element, the parallel lead circuit elements are inserted into and thereafter secured to the printed circuit board disposed in the table 20 in the manner described in detail in U.S. patent application Ser. No. 672,944.

It is noted that conventional reel assembly supply apparatus of the type detailed above is less than completely satisfactory for several reasons. Initially, in order to prepare the supply apparatus for use, each of the reel assemblies must be removed from the case in which same is packaged and stored and positioned on the support assembly shafts. Moreover, each of the reel assemblies are positioned so that the reels 8 are parallel to the reel support member 11, resulting in a considerable area being required to accommodate each of the reels, thereby increasing not only the size of the reel support member 11, but additionally, the overall size of the machinery utilized to process and secure the parallel lead circuit elements to the printed circuit board. Additionally, as a practical matter, the increased size renders maintenance and inspection more difficult. Finally, the weight of the web carriers often causes same to hang down between the feed rollers 14 and the guide rollers 15 thus placing the web carriers in contact with one another and rendering the operation of the supply assembly less reliable. Finally, the flexible guide plates 22, disposed between the guide 15 on the reel support member 11 and the guide 16 positioned at the supply zone, is repeatedly deformed by the respective raising and lowering of the guide plate 16, thereby causing damage to the flexible guide plate at the respective ends of the guide plates that are coupled to the guides 15 and 16, which damage often renders operation of the assembly less reliable. As is detailed below, the instant invention is particularly characterized by an apparatus for permitting both storage and supply of parallel lead electronic circuit elements disposed on a web carrier, which apparatus is particularly suited for use with apparatus of the type utilized to process and secure parallel lead electronic circuit elements to a printed circuit board.

Figure 5:
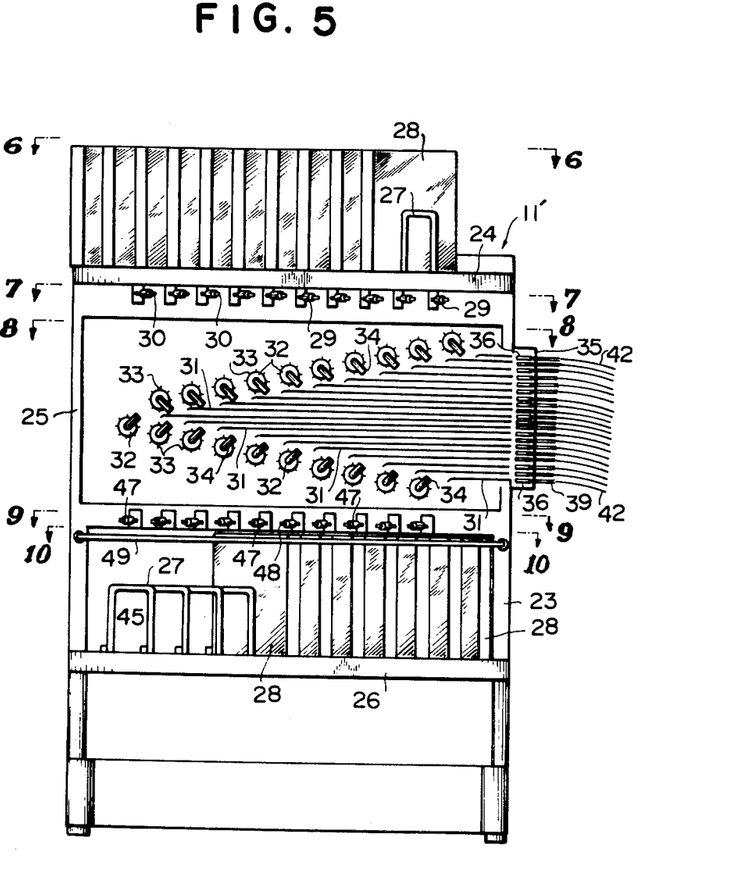
FIG. 5 is an elevational view of an apparatus for storing and supplying parallel lead circuit elements constructed in accordance with a preferred embodiment of the instant invention.
Figure 6:
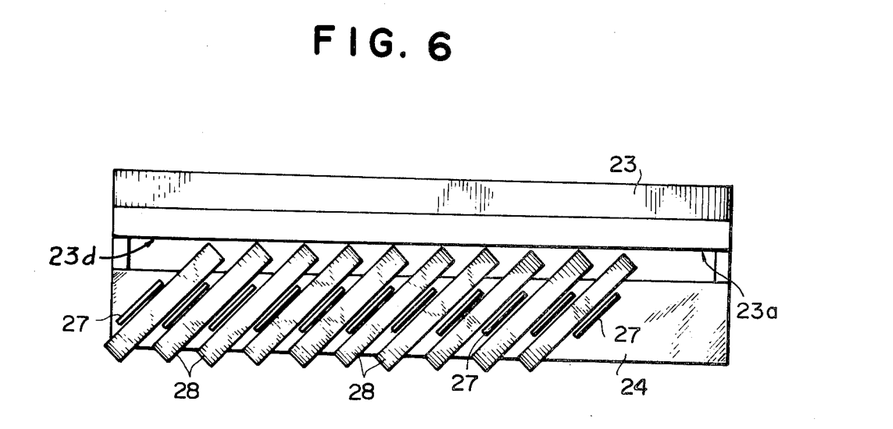
FIG. 6 is a sectional view taken along line 6—6 of FIG. 5.
Figure 7:
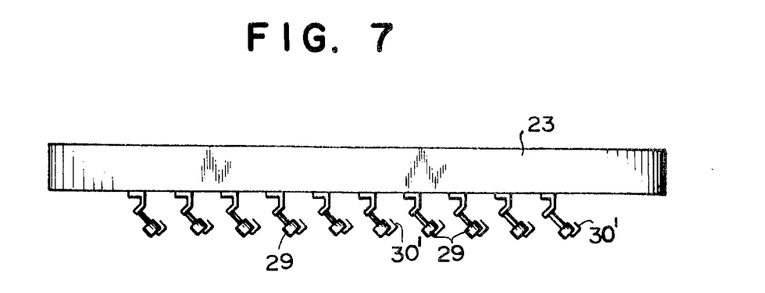
FIG. 7 is a sectional view taken along line 7—7 of FIG. 6.
Figure 8:
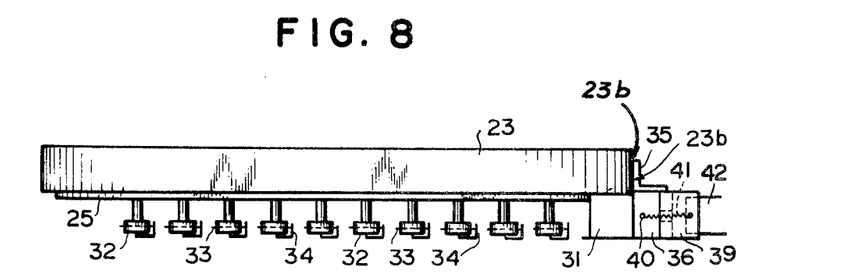
FIG. 8 is a sectional view taken along line 8—8 of FIG. 5.
Figure 9:
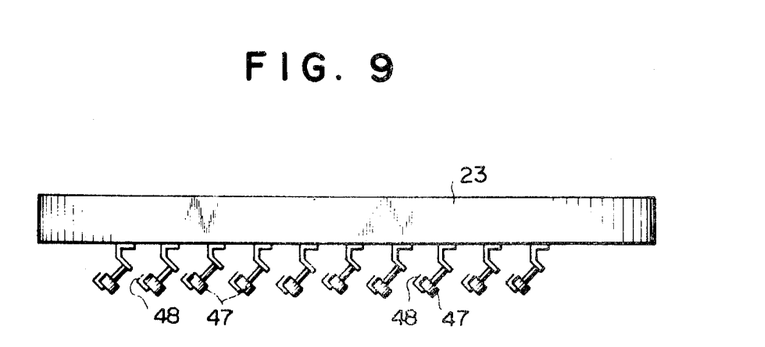
FIG. 9 is a sectional view taken along line 9—9 of FIG. 5.
Figure 10:
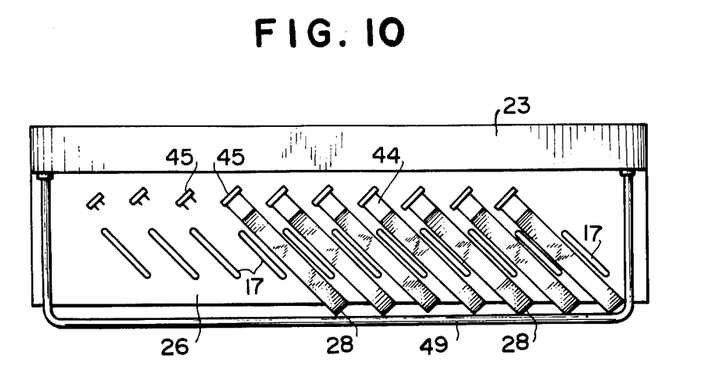
FIG. 10 is a sectional view taken along line 10—10 of FIG. 5.

Reference is now made to FIGS. 5 through 10, wherein apparatus for storing and supplying parallel lead circuit elements, in accordance with the instant invention, is depicted. A reel support, storage and supply member, generally indicated as 11', includes an upright support frame 23 having a front surface 23a and a side surface 23b, the side surface 23b being adapted to face toward the insertion apparatus. The support frame 23 supports an upper case support plate 24, a guide panel 25 disposed intermediate the upper and lower portions of the support frame 23, and a lower case support plate 26. The upper case support plate 24 is adapted to support a plurality of storage cases 28, which storage cases have reel assemblies disposed therein, the construction of the respective cases being described in detail below. The cases 28 are supported on the upper case support plate 24 and are secured at predetermined positions by fixing stands 27 to permit the web carriers, wound within the respective cases 8, to be removed from the cases at a lower portion thereof. As is illustrated in FIG. 6, each of the cases 28 are disposed at a particular angle with respect to the front surface 23a of the support frame 23 in order to reduce the size of the reel support member 11'. It is noted however that if the angle between the front surface 23a and the cases is made too small, no substantial reduction in space is obtained. However, if the angle between the front surface 23a and the cases approximates 90°, considerable twisting of the web carrier can results when the web carriers are fed, thereby resulting in a less than completely satisfactory operation of the storage and supply apparatus. Although, as a practical matter, the angle can be within the range of 0° to 90°, in order to maximize the reduction in space and, additionally, minimize the problems that occur due to twisting of the webs, a preferred range of 30° to 60° is desired. The lower case support plate 26 is adapted to position cases at an angle with respect to the front surface in a manner similar to the upper case support plate 24, the angle being within the same range as the upper case support plate, but with the orientation of the cases reversed on the lower support plate from the orientation of the cases on the upper support plate. Below the upper case support plate 24 is disposed upper guide rollers 29, which guide rollers are supported by the support frame 23 at positions proximate to the openings in the cases 28 to facilitate removal of the web carriers from the cases when the cases are positioned on the upper case support plate, in the manner detailed above. In order to avoid any problems that might occur due to the twisting of the web carriers, each of the shafts 30, supporting the guide roller, are inclined with respect to the front surface 23a of the frame 23 at substantially the same angle as the cases, so that the web carriers are removed from the respective cases at an angle that coincides with the positioning of the case. It is noted that each of the upper guide rollers 29 also includes a retaining pin 30', which pin is adapted to be resiliently positioned against the web and prevent the web from falling out of engagement with the guide roller 29.

Figure 12:
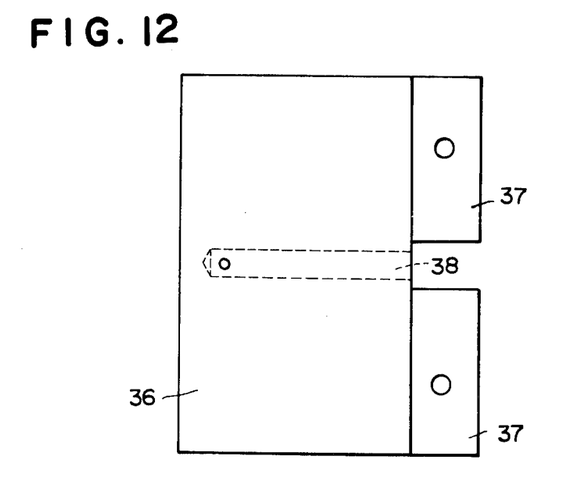
FIG. 12 is a plan view of a separator plate constructed in accordance with a preferred embodiment of the instant invention.
Figure 13:
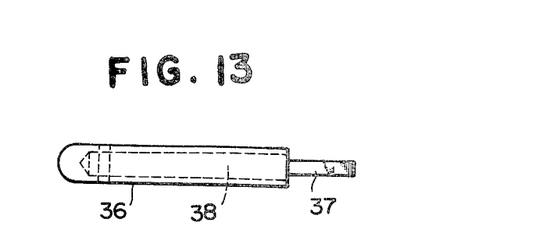
FIG. 13 is an elevational view of the separator plate illustrated in FIG. 12.
Figure 14:
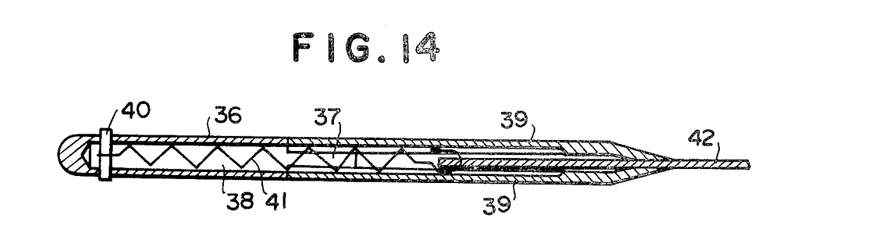
FIG. 14 is an elevational view, in section, illustrating the manner in which the second guide plate is secured to the separator plate illustrated in FIG. 12.
Figure 15:
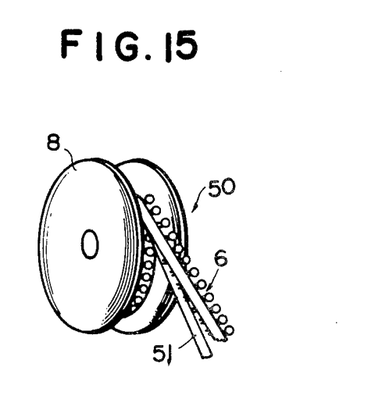
FIG. 15 is a perspective view of a parallel lead circuit element web carrier reel assembly constructed in accordance with a preferred embodiment of the instant embodiment.

The guide panel 25 supports a plurality of guide plates 31 of different lengths, each of the guide plates being disposed in a staggered but parallel relationship with respect to each other, the staggered relationship resulting from the positioning of the ends of each of the guide plates 31 proximate to feed rollers 33. Each feed roller is associated with a guide roller 29 for feeding the web carrier delivered from the cases 28. Specifically, each delivery roller 32 includes projections (sprockets) 33 on the periphery thereof for intermitently feeding a web carrier when the feed roller 32 is rotated through a predetermined pitch by an appropriate drive mechanism (not shown), which drive mechanism is programmed to control the operation of the feed rollers. In addition to the sprockets 33, disposed on the feed rollers, each of the feed rollers 32 include retaining pins 34, which retaining pins resiliently press against the respective webs in order to maintain same in contact with the feed rollers. A support base 35 is mounted to a side face 23b of the frame 23 to support a plurality of separator plates 36, the separator plates 36 being oriented to receive the web as same is directed along the guide plates 31 and effect a directing of same toward the supply zone of the insertion mechanism. Referring specifically to FIGS. 12 and 13, each of the separator plates 36 include projections 37 and an elongated opening 38. The projections 37, on the separator plates 36, are adapted to be inserted into slide plates 39 in a manner to effect a firm grip between the separator plate 36 and slide plate 39. It is noted that slide plate 39, in combination with a spring 41, slideably secures a second guide plate 42 to the slide plate 39, the spring 41 being secured to a fixed element 40 in the separator plate 36. By disposing the respective slide plates in contact with respect to each other, and by effecting a slideable positioning of the second guide plate in the slide plate 39, by use of compression spring 41, the slide plate 39 and second guide plate 42 will be resiliently tensioned and will permit the second guide plate to be slideably displaced in and out of the slide plate 39 so that the changing of the elevation of the supply zone will not cause damage to the guiding arrangement formed thereby.

Figure 11:
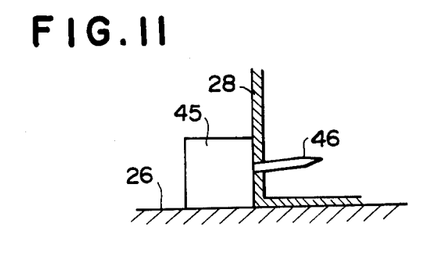
FIG. 11 is a sectional elevational view of a stopper assembly constructed in accordance with a preferred embodiment of the instant invention.

The lower case support plate 26 is also disposed on the front surface 23a of the support frame 23. As is detailed above, the cases 28 are disposed on the lower case support plate 26 in the same manner as the cases are disposed on the upper support plate with the exception that the cases on the lower case support plate are angularly oriented oppositely to those on the upper case support plate. Each of the cases 28, disposed on the lower case support plate, are positioned by fixing stands 27 at specific intervals with respect to each other. Additionally, a stopper 45 is positioned at the rear of each of the upright frames in order to fixably position the cases on the lower case support plate 46. As is illustrated in detail in FIG. 11, each of the stoppers 45 is provided with a sharp projection 46, which projection pierces a side plate of the case 28 to thereby secure same in position. Lower guide rollers 47 are secured to the front surface of the frame at an angle corresponding to the angle at which the cases are positioned, to effect a guiding of the web carrier from the cases in the same manner noted above with respect to the upper guide rollers 29. Each of the lower guide rollers 47 is provided with a retaining pin 48, which retaining pin is resiliently baised against the web to insure that same does not fall away from the guide roller 47. It is noted that each of the guide rollers 48 is positioned proximate to the openings 44 in the cases 28, which openings are provided for permitting the web carrier to be removed from the case 28. Additionally, additional feed rollers 32, having sprockets 33 and a retaining pin 34, are adapted to feed the web carrier to the guide plate 31 to permit same to be delivered to the supply zone of the inserting assembly, in a manner to be discussed in greater detail below.

Figure 16:
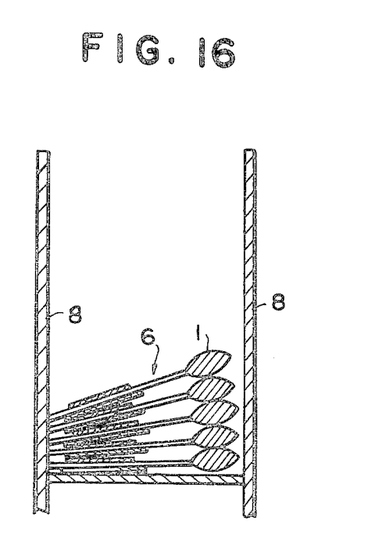
FIG. 16 is a sectional view of a parallel lead circuit element carrier web reel assembly constructed in accordance with the prior art.
Figure 17:
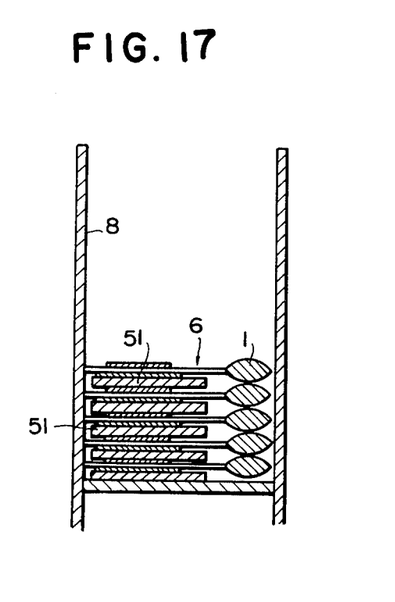
FIG. 17 is a sectional view of a parallel lead circuit element carrier web reel assembly constructed in accordance with the preferred embodiment of the instant invention.
Figure 18:
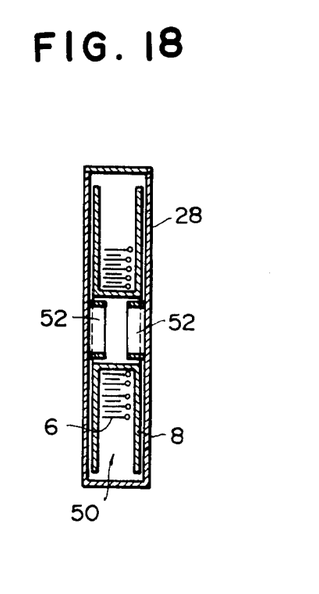
FIG. 18 is a sectional view of the case for supporting a parallel lead circuit element carrier web reel assembly constructed in accordance with a preferred embodiment of the instant invention.

Reference is now made to FIGS. 15 through 18, wherein a reel assembly, generally indicated as 50, and the manner in which same departs from the reel assemblies of the prior art, is depicted, like reference numerals being utilized to denote like elements detailed above. Although the web 6 is wound upon the reel 8, the web carrier is formed with a elongated spacer 51, which spacer is inserted along the entire length of the web carrier between the support member and adhesive tape. Without the elongated spacer 51, the parallel lead circuit element becomes inclined with respect to each other, as is illustrated in FIG. 16, when the web carrier is wrapped upon the reel 8. Such an inclination is troublesome when the web carrier is unreeled and renders operation of the supply apparatus less reliable. Nevertheless, as is illustrated in FIG. 17, by incorporating an elongated spacer 51 along the entire lengthwise extent of the web carrier 6, each of the parallel lead circuit elements, and in particular the leads thereof, are disposed in parallel with respect to each other, thereby facilitating the operation of the storage and supply apparatus. Moreover, as is illustrated in FIG. 18, the reel assembly 50, including the web carrier 6 and reel 8, are rotatably disposed in the case 28 and are rotatably supported on projections 52, to thereby permit the web carrier to be unwound from the reel 8 without removing the reel 8 from the case 28. The opening 44, disposed in the case, is preferably a perforated opening to permit the case to be positioned on the upper or lower case support member whereafter the perforation can be broken to permit the web to be readily fed by the supply and storage mechanism.

Figure 19:
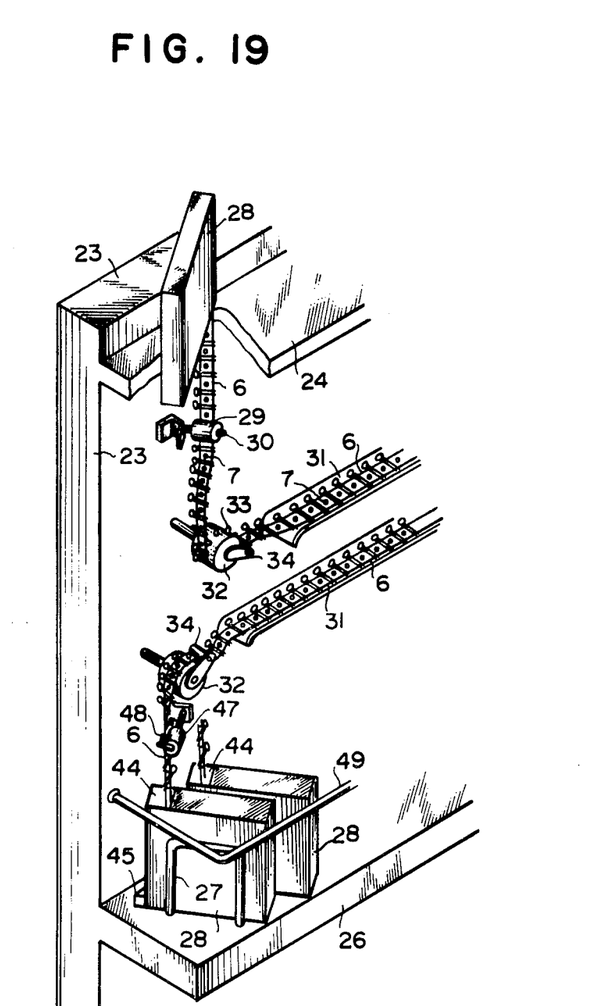
FIG. 19 is a part perspective view of the apparatus for storing and supplying parallel lead circuit elements depicted in FIG. 5.
Figure 20:
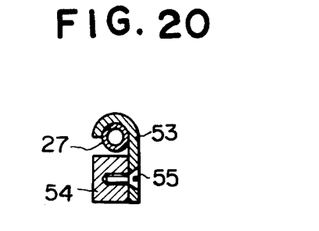
FIG. 20 is a sectional view of a spacer for use with the apparatus depicted in FIG. 5.

Reference is now made to FIG. 19, wherein the operation of the supply and storage mechanism, detailed above, is depicted. Each of the cases 28 are disposed on either the upper case support member 24 or lower case support member 26 in the manner detailed above, and are fixedly positioned with respect to each other by fixing frames 27 and stoppers 45. The cases are positioned so that the openings 44 therein are proximate to the respective upper and lower guide rollers. It is noted that when the cases 28 are of reduced thickness, with respect to the clearance provided by the fixing stand 27, as is illustrated in FIG. 20, spacers 53 and 54 are secured to the stands 27 by a screw 55, the spacers 53 and 54 causing the case to be securely gripped by the fixing stand 27.

Utilizing the cases positioned on the lower case support member 26, as an example, the web carrier 6 is continuously incrementally removed or unwound from the reeled assembly therein by the feed roller 32. The only twisting in the web carrier is between the guide roller 47 and the feed roller 34, thereby effecting a twisting of the web carrier at a position that is least likely to affect the operation thereof. The sprockets 33, on the feed roller 32, engage the openings in the web to thereby effect an incremental feeding of same in accordance with the pitch through which the feed roller is rotated during each advancement of the web carrier. Similarly, the cases 28 permit the web carriers 6 to be guided by guide rollers 29 and fed by feed rollers 32 in the same manner detailed above with respect to the web carrier contained in the cases positioned on the lower case support member 26. It is noted however that an opening (not shown) must be formed in the upper support member 24 in order to permit the web carrier to be removed therefrom and readily fed to the guide roller 29 and feed roller 32.

In a preferred embodiment, the spacer 51 can be separated from the web carrier when the web carrier is first displaced through the opening 44 in the case. For example, for the case 28, disposed on the upper case support member 24, when the web carrier is twisted between the guide roller 29 and feed roller 32, the spacer will separate from the web carrier, and appropriate means for disposing of same can readily be provided to take advantage of the natural separation that will occur once the web carrier passes the guide roller and thereafter is twisted.

Accordingly, the web carrier 6 is incrementally advanced along the guide plate 31, through the separator 36 along the slide plate 39 and, finally, over the second separate guide plate 42 (see FIG. 5). The separate guide plates 42 are secured at their other end to the inserting mechanism, which inserting mechanism is part of the apparatus for processing and securing the parallel lead circuit elements to a printed circuit board. As noted above, although the relative height of the second separate guide plate 42 is continuously being adjusted, the manner in which the second guide plate is slideably secured in slide plate 39, and tensioned therein by spring 41, permits the elevation of the second guide plate to be continuously changed without, it any way, adversely affecting the operation of the feed mechanism.

It is noted that the instant invention is particularly characterized by improved apparatus for storing and supplying parallel lead circuit elements to an apparatus for processing and securing parallel lead electronic circuit elements to a printed circuit board. To this end, the instant invention permits the cases utilized for shipping and storing the reeled assemblies to be directly mounted to the storage and supply apparatus in a predetermined position to permit the web carriers to be directly fed from the cases by the apparatus. Moreover, by disposing the cases at predetermined positions, the size of the supply and storage apparatus is reduced, thereby simplifying maintenance and inspection thereof. Moreover, by providing a plurality of guide plates proximate to each of the feed rollers, contact between the respective web carriers is avoided, thereby improving the reliability of the apparatus.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. An apparatus for storing and supplying parallel lead circuit elements disposed on an elongated web carrier in combination with a mechanism for processing and securing said circuit elements to a printed circuit board comprising in combination, a plurality of cases, each of said cases supporting a reel therein, said reel being adapted to wind an elongated web carrier thereabout, support means for supporting said plurality of cases at predetermined positions, guiding and feeding means supporting by said support means, each of said guiding and feeding means being disposed proximate to one of said cases for incrementally advancing said web carried from said case, independently of the incremental advancement of each other web carrier advanced from each of said other cases, a plurality of guide plates disposed in parallel with respect to each other, each of said guide plates being disposed proximate to each of said guiding and feeding means in order to receive the web carrier incrementally advanced by said guiding and feeding means and guide same toward a mechanism particularly suited to process and secure the circuit elements to said printed circuit board and, a plurality of separator plates supported by said support means, each of said separator plates being disposed adjacent to a guide plate for receiving the web carrier guided thereby, a plurality of slide plates, each of said slide plates being disposed in abutment with said separator plate, and a plurality of second guide plates, each of said second guide plates being secured to said mechanism for processing and securing the circuit elements to a printed circuit board, to permit the second guide plate to be slideably displaced with respect to the slide plate when the ends of said second guide plate are at different elevations.

2. An apparatus for storing and supplying parallel lead circuit elements disposed on an elongated web carrier in combination with a mechanism for processing and securing said circuit elements to a printed circuit board, as claimed in claim 1, wherein said second guide plate is resiliently secured in said slide plate by a spring secured to said separator plate in order to assure positioning of said second guide plate with respect to said slide plate when the ends of said second guide plate are at different elevations.

3. An apparatus for storing and supplying parallel lead circuit elements disposed on an elongated web carrier in combination with a mechanism for processing and securing said circuit elements to a printed circuit board, as claimed in claim 1, wherein said support means includes a support member supporting said guiding and feeding means and a support plate for supporting each of said cases at a predetermined angle with respect to said support member, said angle being within a range of 30° to 60°.

4. An apparatus for storing and supplying parallel lead circuit elements disposed on an elongated web carrier in combination with a mechanism for processing and securing said circuit elements to a printed circuit board, as claimed in claim 3, wherein said support plates include a plurality of stands secured thereto, said stands being adapted to fixedly position said cases at a predetermined angle with respect to said support member and with respect to each other.

5. An apparatus for storing and supplying parallel lead circuit elements disposed on an elongated web carrier in combination with a mechanism for processing and securing said circuit elements to a printed circuit board, as claimed in claim 4, and including a stopper disposed proximate to each said stand, each of said stoppers having a projection for piercing said case and releasably positioning said case on said support plate.

6. An apparatus for storing and supplying parallel lead circuit elements disposed on an elongated web carrier in combination with a mechanism for processing and securing said circuit elements to a printed circuit board, as claimed in claim 3, wherein each of said feeding and guiding means includes a guide roller for guiding said web carrier and a feed roller for feeding said web carrier, said guide roller being rotatably disposed on an axis having substantially the same angular orientation with respect to said support member as said cases.

7. An apparatus for storing and supplying parallel lead circuit elements disposed on an elongated web carrier in combination with a mechanism for processing and securing said circuit elements to a printed circuit board, as claimed in claim 6, wherein each of said guide rollers includes a retaining pin disposed in resilient engagement with the web carrier for maintaining the web carrier in engagement with the guide roller when the web carrier is guided thereby.

8. An apparatus for storing and supplying parallel lead circuit elements disposed on an elongated web carrier in combination with a mechanism for processing and securing said circuit elements to a printed circuit board, as claimed in claim 7, wherein each said feed roller includes a retaining pin disposed in resilient engagement with the web carrier for maintaining the web carrier in engagement with the feed roller when the web carrier is fed thereby.

9. An apparatus for storing and supplying parallel lead circuit elements disposed on an elongated web carrier in combination with a mechanism for processing and securing said circuit elements to a printed circuit board, as claimed in claim 3, wherein said support means includes a further support plate disposed at a different elevation than said first mentioned support plate, said feeding and guiding means and said guide plates being disposed at an intermediate elevation with respect to said first-mentioned support plate.

10. An apparatus for storing and supplying parallel lead circuit elements disposed on an elongated web carrier in combination with a mechanism for processing and securing said circuit elements to a printed circuit board, as claimed in claim 1, wherein said web carrier includes openings therein, said openings being equidistantly spaced along the lengthwise extent of said web carrier, each said guiding and feeding means including a driver means for engaging said openings in said web carrier in order to incrementally advance said web carrier from said case.

* * * * *